United States Patent
Kula et al.

(10) Patent No.: US 6,913,782 B2
(45) Date of Patent: Jul. 5, 2005

(54) FABRICATION OF SELF-ALIGNED REFLECTIVE/PROTECTIVE OVERLAYS ON MAGNETORESISTANCE SENSORS, AND THE SENSORS

(75) Inventors: Witold Kula, Cupertino, CA (US); Alexander Michael Zeltser, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 93 days.

(21) Appl. No.: 10/309,938

(22) Filed: Dec. 3, 2002

(65) Prior Publication Data

US 2004/0105937 A1 Jun. 3, 2004

(51) Int. Cl.$^7$ .................................. B05D 3/00
(52) U.S. Cl. ...................... 427/130; 427/131; 427/404; 427/419.1; 427/419.2; 427/419.3; 360/313; 360/324
(58) Field of Search ............................. 427/127, 128, 427/130, 131, 402, 404, 419.1, 419.2, 419.3; 360/310, 313, 324

(56) References Cited

U.S. PATENT DOCUMENTS

| | | | |
|---|---|---|---|
| 5,898,612 A | 4/1999 | Chen et al. | 365/158 |
| 5,999,379 A | 12/1999 | Hsiao et al. | 360/113 |
| 6,134,090 A | 10/2000 | Mao et al. | 360/324.1 |
| 6,175,477 B1 | 1/2001 | Lin et al. | 360/324.12 |
| 6,181,534 B1 | 1/2001 | Gill | 360/324.11 |
| 6,208,491 B1 | 3/2001 | Pinarbasi | 360/324.1 |
| 6,266,218 B1 | 7/2001 | Carey et al. | 360/324.12 |
| 6,268,985 B1 | 7/2001 | Pinarbasi | 360/324.1 |
| 6,473,278 B1 | 10/2002 | Gill | 360/324.1 |
| 6,709,767 B2 * | 3/2004 | Lin et al. | 428/611 |
| 6,759,120 B2 * | 7/2004 | Jongill et al. | 428/336 |
| 2001/0006444 A1 | 7/2001 | Hayakawa et al. | 360/324.1 |

FOREIGN PATENT DOCUMENTS

JP 2000-252548 9/2000 ............ G11B/5/39

OTHER PUBLICATIONS

T. Lin et al., Effects of Oxide See And Cap Layers On Magnetic Properties Of A Synthetic Spin Valve, Apr. 9, 2001.,vol. 78, No. 15, pp. 2181–2183.

J. Hong et al., Effect Of Thin Film Oxide Capping On Interlayer Coupling In Spin Valves, Pre-print From Intermag 2000, BQ-12.

(Continued)

*Primary Examiner*—Timothy Meeks
*Assistant Examiner*—William Phillip Fletcher, III
(74) *Attorney, Agent, or Firm*—Ronald B. Feece; Lewis L. Nunnelley

(57) ABSTRACT

A magnetoresistance sensor is fabricated using a sensor structure including a free layer deposited upon a lower layered structure and depositing an oxide structure overlying the free layer. The depositing of the oxide structure includes the steps of depositing a buffer layer overlying the free layer, wherein the buffer layer is a buffer-layer metal when deposited, depositing an overlayer overlying and contacting the buffer layer, the overlayer being an overlayer metallic oxide of an overlayer metal, and oxidizing the buffer layer to form a buffer layer metallic oxide.

4 Claims, 4 Drawing Sheets

OTHER PUBLICATIONS

K. Nagasaka et al., Giant Magnetoresistance Properties Of Specular Spin Valve Films In a Current Perpendicular To Plane Structure, Jun. 1, 2001, vol. 89, No. 11, pp. 6943–6945.

M. F. Gillies et al., Effect Of Thin Oxide Layers Incorporated In Spin Valve Structures, Jun. 1, 2001, vol. 89, No. 11, pp. 6922–6924.

S. X. Wang et al., Specularity In GMR Spin Valves And In Situ Electrical And Magnetotransport Measurements, Sep. 5, 2000, IEEE Transactions on Magnetics, vol. 36., No. 5, pp. 2841–2846.

J. Hong et al., Magnetic And Electrical Properties Of Spin Valve With Single and Double Specular Oxide Layers, Jun. 1, 2001, vol. 89, No. 11, pp. 6940–6942.

C. Lai et al., Giant Magnetoresistance Enhancement In Spin Valves With Nano–Oxide Layers, Jun. 1, 2001, vol. 89, No. 11, pp. 6928–6930.

W. F. Egelhoff Jr et al., Oxygen As A Surfactant In The Growth Of Giant Magnetoresistance Spin Valves, Dec. 12, 1997, J. Appl. Phys. 82, pp. 6142–6151.

U.S. Appl. No. 09/803,479, filed Mar. 8 2001.

U.S. Appl. No. 09/827,618, filed Apr. 6, 2001.

U.S. Appl. No. 09/753,968, filed Jan. 21, 2001.

U.S. Appl. No. 09/919,280, filed Jul. 31, 2001.

U.S. Appl. No. 09/886,832, filed Jun. 20, 2001.

U.S. Appl. No. 10/066,835, filed Feb. 4, 2002.

* cited by examiner

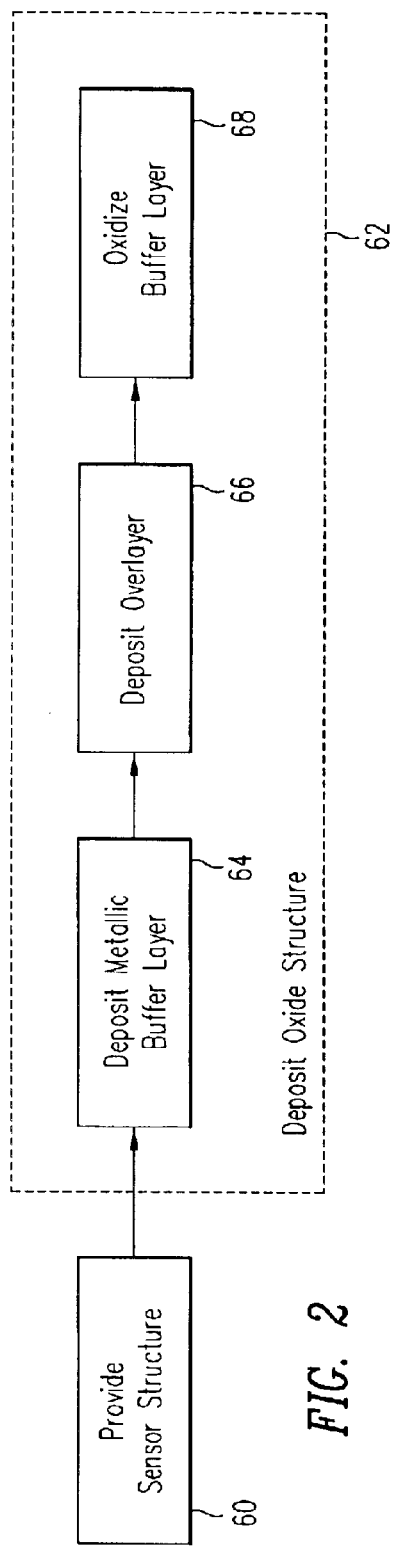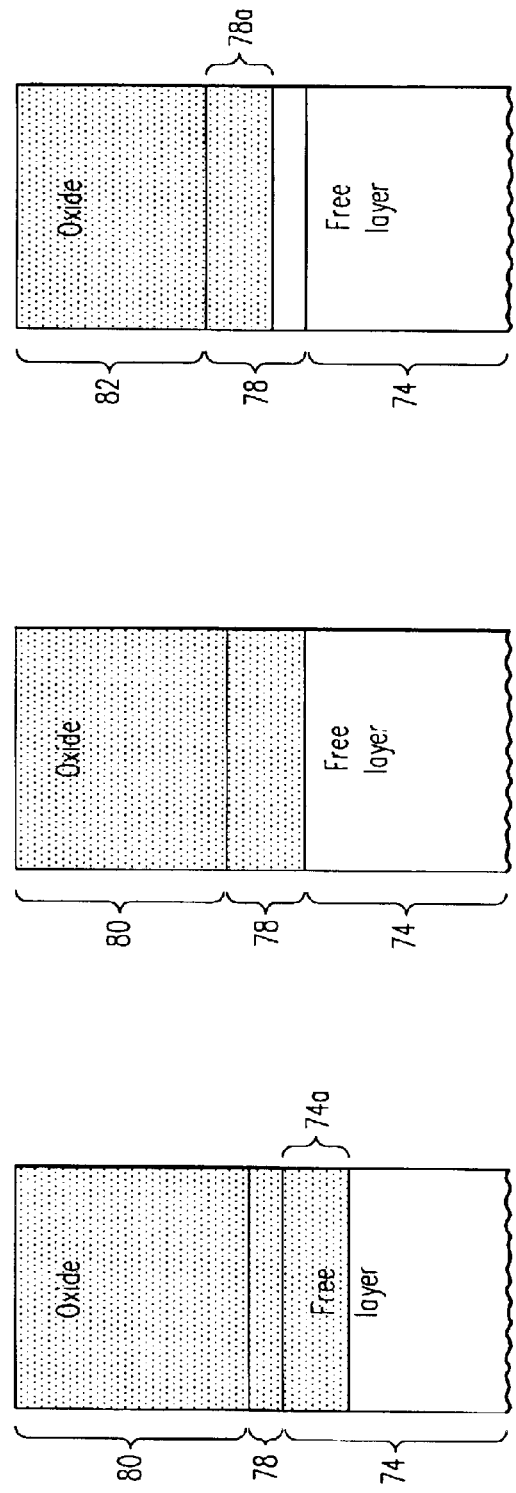

FABRICATION OF SELF-ALIGNED REFLECTIVE/PROTECTIVE OVERLAYS ON MAGNETORESISTANCE SENSORS, AND THE SENSORS

BACKGROUND OF THE INVENTION

A magnetoresistance (MR) sensor is used in a read/write head to read magnetic fields on a recording medium of a magnetic storage device. An example is the read/write head of a computer hard disk drive or a magnetic recording tape drive. The read/write head is positioned closely adjacent to the recording medium in the case of the computer hard disk drive, separated from the recording medium by an air bearing, or even touching the recording medium. A data bit is written onto an area of the recording medium by locally changing its magnetic state using the writing portion of the read/write head. That magnetic state is later sensed by the MR sensor, which is the reading portion of the read/write head, to read the data bit.

Two known types of MR sensors are a giant magnetoresistance (GMR) sensor and a tunnel magnetoresistance (TMR) sensor. The general technical basis, construction, and operation of the GMR sensor are described, for example, in U.S. Pat. No. 5,436,778. The general technical basis, construction, and operation of the TMR sensor are described, for example, in U.S. Pat. No. 5,729,410. The disclosures of both patents are incorporated by reference in their entireties. These patents also describe the read/write heads and the magnetic storage systems.

The structure of the MR sensors, such as the GMR sensor or the TMR sensor, includes two thin-film stacks separated by an intermediate nonmagnetic film. The intermediate nonmagnetic film is typically a copper film or an aluminum oxide film, serving as a spacer layer for the GMR or the TMR sensors, respectively. In one form, the lower thin-film stack includes a transverse (perpendicular to an air bearing surface of the sensor) magnetic biasing structure, and the upper thin-film stack includes a sensing stack with a free layer that responds to an external magnetic field. A longitudinal (parallel to the air bearing surface) magnetic hard biasing structure is present, either as part of the upper thin-film stack or positioned laterally from the thin-film stacks. These stacks may be inverted, as well.

An overlayer or cap layer is deposited over the thin-film stacks. The performance of the MR sensor depends upon the nature of the overlayer. Although a number of different overlayers have been utilized and are operable, they do not provide an optimum combination of performance and stability. There is accordingly a need for an improved overlayer structure. The present invention fulfills this need, and further provides related advantages.

SUMMARY OF THE INVENTION

The present invention provides a method for fabricating a magnetoresistance sensor, and a magnetoresistance sensor made by this approach. The method provides an optimized combination of maximized electron specular reflection, and a high-quality, stable interface with the underlying structure. The overlayer is electrically non-conducting and serves as an effective diffusion barrier protecting the sensor from deterioration during device processing and fabrication. The dR/R performance of the MR sensor is improved significantly as compared with prior techniques. The approach is tolerant of a range in fabrication parameters.

In accordance with the invention, a method for fabricating a magnetoresistance sensor comprises the steps of providing a sensor structure including a free layer deposited upon a lower layered structure, and depositing an oxide structure overlying the free layer. The sensor structure is preferably a giant magnetoresistance sensor. The step of depositing the oxide structure includes the steps of depositing a buffer layer overlying the free layer, the buffer layer being a buffer-layer metal when deposited, and thereafter depositing an overlayer overlying and contacting the buffer layer, the overlayer being an overlayer metallic oxide of an overlayer metal. The buffer layer is oxidized to form a buffer layer metallic oxide. The oxide structure is preferably not less than about 25 Angstroms thick.

The buffer-layer metal is preferably tantalum, aluminum, titanium, zirconium, hafnium, yttrium, chromium, magnesium or silicon (all of which for the present purposes are considered metals). The overlayer metal and the buffer-layer metal may be the same metal or different metals.

The steps of oxidizing the buffer layer and depositing the overlayer are preferably performed at least in part simultaneously. The step of oxidizing the buffer layer may be continued at least in part after the step of depositing the overlayer is complete, as by annealing the magnetoresistance sensor including the buffer layer.

The buffer layer preferably has a thickness of not less than about 5 Angstroms, and most preferably from about 5 to about 25 Angstroms.

The oxidizing of the buffer layer preferably oxidizes not less than about 80 percent of the buffer-layer thickness. Most preferably, the oxidizing of the buffer layer oxidizes from about 90 to about 100 percent of the buffer-layer thickness.

Most preferably, substantially none of the free layer is oxidized.

The present approach ensures a high-quality interface between the overlying oxide structure and the underlying sensor structure. The nature of the interface is well controlled, because the metallic buffer layer is deposited and thereafter oxidized. By contrast, when an oxide layer is deposited directly over the free layer, it is difficult to control the amount of oxidation of the free layer and the nature of the interface.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 2 is a block flow diagram of an approach for fabricating a magnetoresistance sensor;

FIGS. 6–8 are schematic elevational views of the sensor structure with varying degrees of oxidation.

DETAILED DESCRIPTION OF THE INVENTION

Figure 1:
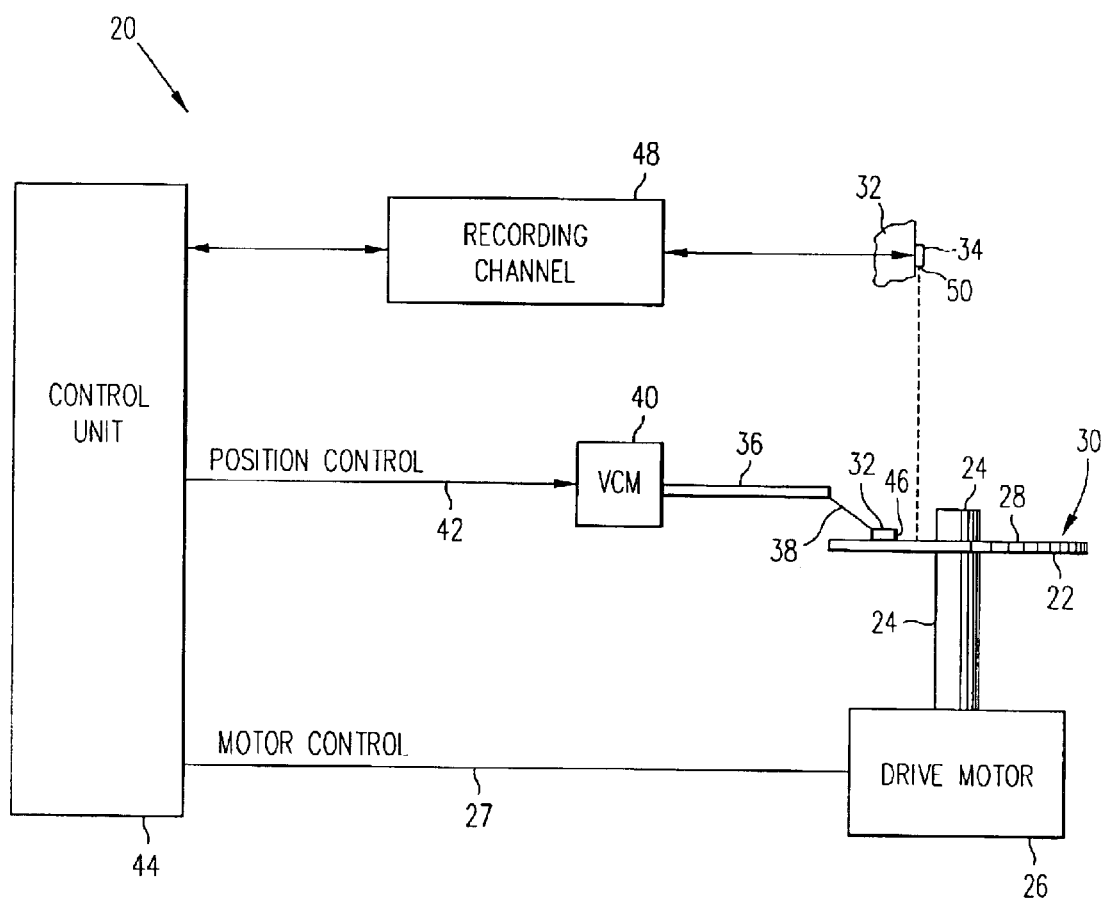
FIG. 1 is a schematic diagram of a magnetic disk data storage system.

FIG. 1 shows a data storage system, here depicted as a magnetic disk drive system 20, with which the present approach may be used. The magnetic disk drive system 20 includes a rotatable magnetic storage disk 22 that is supported on a spindle 24 and rotated by a disk drive motor 26 under motor control 27 of a control unit 44. A magnetic storage medium 28 is deposited on a surface 30 of the magnetic storage disk 22.

A slider 32 is positioned in facing relation to the magnetic storage disk 22. The slider 32 supports at least one read/write head 34 in facing relation to the magnetic storage medium 28 of the magnetic storage disk 22. The slider 32 is mounted to an actuator arm 36 by a suspension 38. The actuator arm 36 and the slider 32 move radially inwardly and outwardly so that the combined inward/outward motion of the slider 32 and the rotation of the magnetic storage disk 22 allows the read/write head to be placed into facing relation to the entire area of the magnetic storage medium. The actuator arm 36 is driven by an actuator 40 (depicted as a voice coil motor or VCM) under the radial position control 42 of the control unit 44.

The suspension 38 generates a slight spring force which biases the slider 32 toward the surface 30 of the magnetic storage disk 22. During sensor operation the magnetic storage disk 22 turns, and an air bearing is created between the downwardly facing surface of the slider 32, termed the air bearing surface 46 or ABS, and the upwardly facing surface 30 of the magnetic storage disk 22. (Only the downwardly oriented slider is illustrated, but there may also or instead be an upwardly oriented slider facing the bottom side of the magnetic storage disk.) The air bearing counterbalances the slight spring force of the suspension 38 and supports the slider 32 a small distance above the surface 30 with a small, substantially constant separation.

The read/write head 34 writes data onto the magnetic storage medium 28 by altering magnetic states in the magnetic storage medium, and also reads data from the magnetic storage medium 28 by sensing the magnetic states in the magnetic storage medium 28. The writing and reading commands, as well as the data to be written or read, are transmitted between the control unit 44 and the read/write head 34 over a recording channel 48. The present approach is concerned with a magnetoresistance (MR) sensor structure 50 that is part of the read/write head 34.

The preceding discussion is a simplified description of the data storage system in the form of the magnetic disk drive system 20, to set the environment in which the present invention is used. The present invention is also applicable to other types of magnetic data storage systems such as tape drives and their read/write heads.

Figure 3:
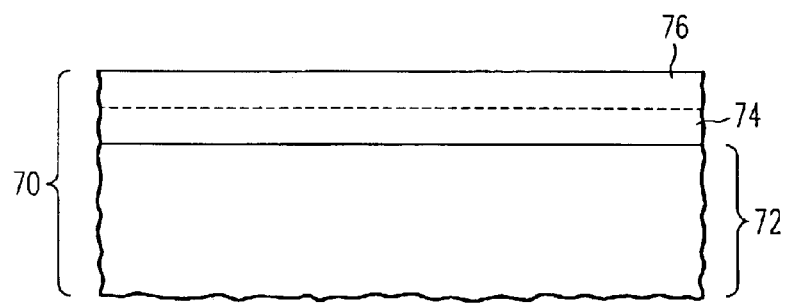
FIGS. 3–5 are schematic elevational views of the sensor structure at various stages in the fabrication processing of FIG. 2.
Figure 4:
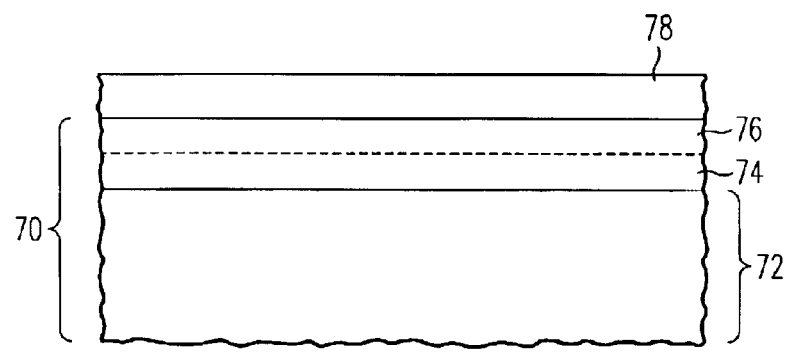
Figure 5:
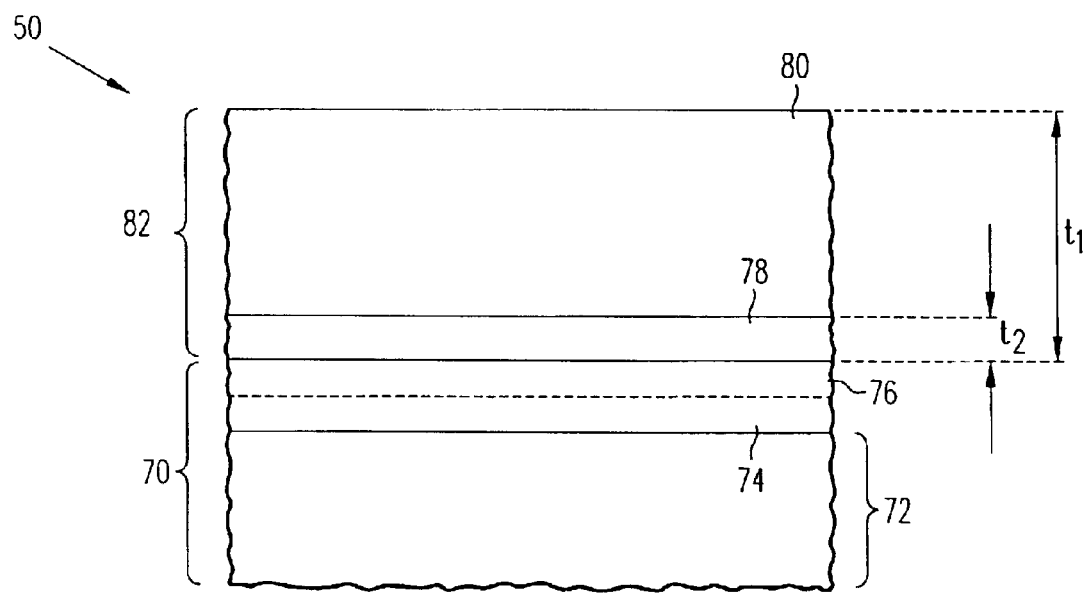

FIG. 2 depicts a preferred approach for fabricating the MR sensor structure 50, and FIGS. 3–5 illustrate the structure at various stages in the fabrication processing. A sensor structure 70 is provided, numeral 60. The sensor structure 70, shown in FIG. 3, includes a lower layered structure 72 and a free layer 74 deposited upon the lower layered structure 72. Optionally, an upper layered structure 76 is deposited upon the free layer 74. The materials of construction and layer thicknesses of the lower layered structure 72, the free layer 74, and the upper layered structure 76 are known in the art. The free layer 74 is typically made of a single layer of a ferromagnetic material such as Co—Fe alloy, or two or more sublayers of ferromagnetic materials. The sensor structure 70 is preferably a giant magnetoresistance (GMR) sensor structure, such as that described in U.S. Pat. No. 5,436,778.

An oxide structure is deposited overlying the free layer, numeral 62. The oxide structure desirably has a thickness of not less than 25 Angstroms. The step 62 of depositing the oxide structure preferably several substeps. A buffer layer 78 is deposited overlying the free layer 74, numeral 64, producing the structure shown in FIG. 4. The buffer layer 78 may be deposited directly in contact with the free layer 74. If the optional upper layered structure 76 is present, the buffer layer 78 is deposited contacting the upper layered structure 76.

The buffer layer 78 is a buffer-layer metal when deposited in step 64. The buffer-layer metal preferably has a greater affinity for oxygen than does the material of the free layer 74. Preferred buffer-layer metals include aluminum and tantalum, but other buffer-layer metals such as titanium, zirconium, hafnium, yttrium, chromium, magnesium or silicon may also be used. The buffer layer 78 is preferably deposited to have a thickness of not less than about 5 Angstroms, and most preferably is deposited to have a thickness of from about 10 to about 15 Angstroms. The buffer layer 78 may be deposited by any technique that is suitable for the selected buffer-layer metal, with sputtering being preferred.

Thereafter, an overlayer 80 is deposited overlying and contacting the buffer layer 78, numeral 66 of FIG. 2. The structure with the deposited overlayer 80 is shown in FIG. 5. The overlayer 80 is deposited as an overlayer metallic oxide of an overlayer metal. The overlayer metal and the buffer-layer metal are preferably the same metal, but they may be different metals. The overlayer 80 is preferably deposited to have a thickness of not less than about 20 Angstroms, and most preferably is deposited to have a thickness of from about 20 to about 50 Angstroms. The overlayer 80 may be deposited by any suitable technique, with reactive sputtering being preferred.

The buffer layer 78 is oxidized, numeral 68 of FIG. 2, to form a buffer layer metallic oxide of the buffer-layer metal. The step 68 of oxidizing the buffer layer 78 is preferably performed at least in part simultaneously with the step 66 of depositing the overlayer 80. That is, the overlayer deposition 66 is preferably performed by a technique such as reactive sputtering in an oxidizing environment, resulting in simultaneous oxidation of the buffer layer 78. The step 68 of oxidizing the buffer layer 78 may be continued after the step 66 of depositing the overlayer 80 is complete. For example, the buffer layer 78 (and typically the entire structure at that stage) is usually annealed after the step 66 of depositing the overlayer 80 is complete to turn on the transverse biasing of the free layer by the Pt—Mn pinning layer that is part of the lowered layered structure 72, and there is typically some further oxidation during the annealing. These two oxidizing approaches may both be used, with the high-temperature deposition 66 of the overlayer 80 accomplishing part of the oxidation of the buffer layer 78, followed by the subsequent annealing.

The completed oxide structure 82 of FIG. 5 includes both the overlayer 80 and the buffer layer 78 converted to an oxide form. The oxide structure 82 desirably has an oxide-layer thickness $t_1$ of not less than about 25 Angstroms, and the buffer-layer metallic oxide 78 (after oxidation) desirably has a buffer-layer thickness $t_2$ of not less than about 5 Angstroms and more preferably from about 10 to about 15 Angstroms.

In any event, it is preferred that not less than about 80 percent of the buffer-layer thickness is oxidized. Most preferably from about 90 to about 100 percent of the buffer-layer thickness is oxidized.

FIGS. 6-8 illustrate various possible extents of the oxidation of the buffer layer 78. Preferably, substantially none of the free layer 74 is oxidized. FIG. 6 depicts a situation wherein the oxidation of the buffer layer 78 has been completed, and also some of the free layer 74 has been oxidized to an oxidized free layer region 74a. This result is undesirable, because the sensing ability of the free layer 74 is degraded, causing a reduction in the functionality of the MR sensor structure 50.

A preferred case is illustrated in FIG. 7, wherein all (100 percent) of the buffer layer 78 is oxidized, no more and no less. Because the initially deposited buffer-layer metal of the buffer layer 78 is selected to have a higher affinity for oxygen than does the metal of the free layer 74, this preferred degree of oxidation is readily achieved.

The partial oxidation of the buffer layer 78 illustrated in FIG. 8, producing an oxidized region 78a that is less than the entire thickness of the buffer layer 78, is less desirable than the complete oxidation of FIG. 7, but more desirable than the over-oxidation that produces the partial oxidation of the free layer 74 as shown in FIG. 6.

Figure 9:
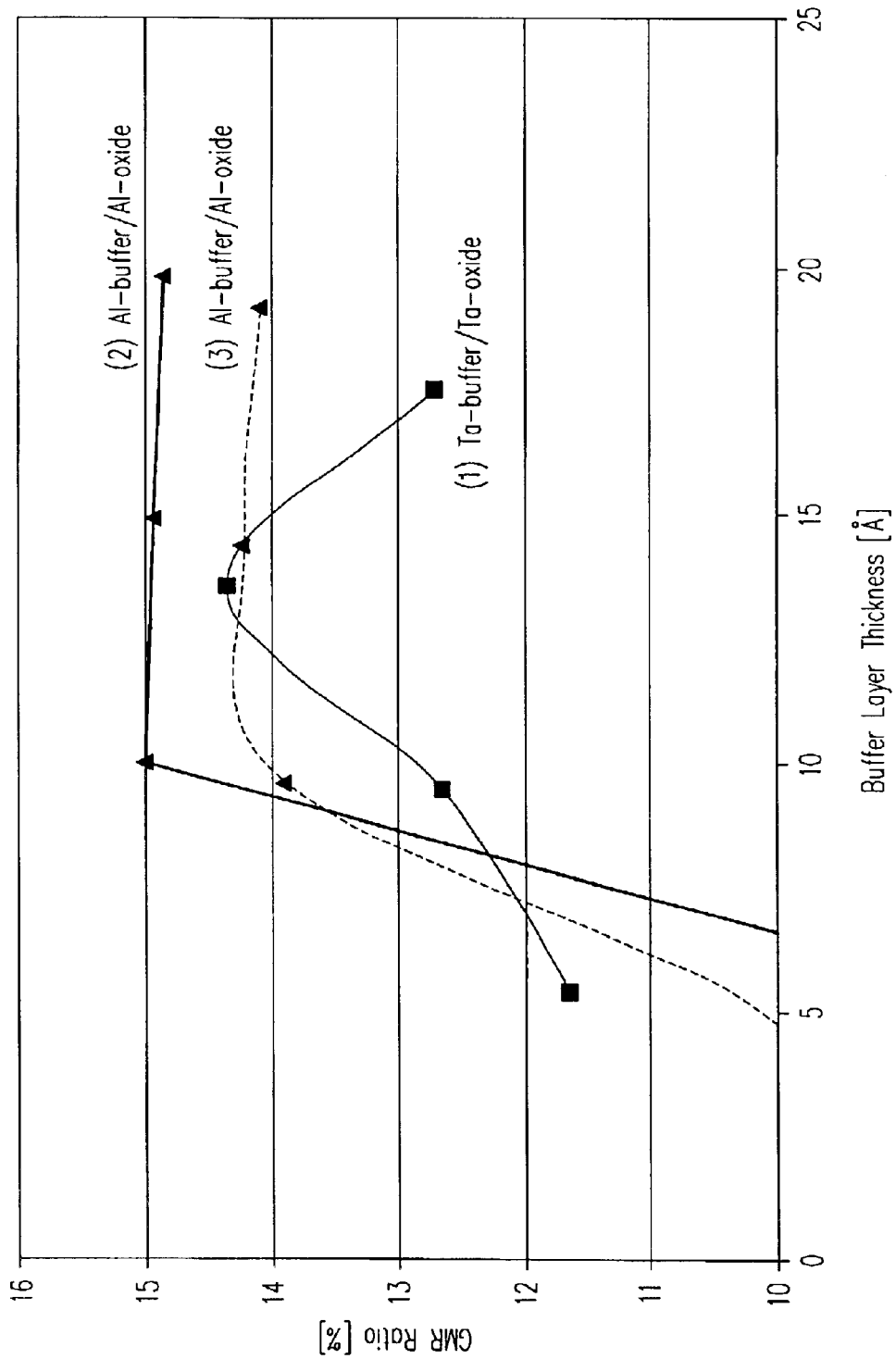
FIG. 9 is a graph of GMR ratio as a function of buffer layer thickness, for three different layered GMR structures.

The present invention has been reduced to practice in several embodiments. The following multilayer MR sensor structures 50 were prepared over a conventional lower layer structure: (1) CoFe/CoFeOx/CuOx/Ta-buffer/TaOx-oxide; (2) CoFe/CoFeOx/Al-buffer/AlOx oxide; and (3) CoFe/NiFe/Al-buffer/AlOx-oxide/Ta. Various thicknesses of the buffer layer 78 were prepared. These specimens were tested for the GMR ratio (dR/R) as a function of the buffer layer thickness, and the results are depicted in FIG. 9. The GMR ratio increases significantly for a buffer-layer thickness of greater than about 5 Angstroms and reaches a maximum in the range of buffer-layer thickness of about 10–15 Angstroms. For greater thicknesses of the buffer layer, the GMR ratio falls, slightly for the Al-buffer specimens and more rapidly for the Ta-buffer specimens. In each case, however, the GMR ratio increases from less than about 13 percent to 14–15 percent when the properly dimensioned buffer layer 78 is selected.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for fabricating a magnetoresistance sensor, comprising:
   providing a sensor structure including a free layer deposited upon a lower layered structure; and
   depositing an oxide structure overlying the free layer, wherein depositing the oxide structure includes
      depositing a buffer layer overlying the free layer, the buffer layer being a buffer-layer metal when deposited, thereafter
      depositing an overlayer overlying and contacting the buffer layer, the overlayer being an overlayer of metallic oxide of an overlayer metal, and oxidizing the buffer layer to form a buffer layer metallic oxide,
   wherein depositing a buffer layer includes depositing the buffer-layer metal selected from the group consisting of tantalum, aluminum, titanium, zirconium, hafnium, yttrium, chromium, magnesium and silicon.

2. A method for fabricating a magnetoresistance sensor, comprising:
   providing a sensor structure including a free layer deposited upon a lower layered structure; and
   depositing an oxide structure overlying the free layer, wherein depositing the oxide structure includes
      depositing a buffer layer overlying the free layer, the buffer layer being a buffer-layer metal when deposited, thereafter
      depositing an overlayer overlying and contacting the buffer layer, the overlayer being an overlayer metallic oxide of an overlayer metal, and
      oxidizing the buffer layer to form a buffer layer metallic oxide,
   wherein the overlayer metal and the buffer-layer metal are the same metal.

3. A method for fabricating a magnetoresistance sensor, comprising:
   providing a sensor structure including a free layer deposited upon a lower layered structure; and
   depositing an oxide structure overlying the free layer, wherein depositing the oxide structure includes
      depositing a buffer layer overlying the free layer, the buffer layer being a buffer-layer metal when deposited, thereafter
      depositing an overlayer overlying and contacting the buffer layer, the overlayer being an overlayer metallic oxide of an overlayer metal, and
      oxidizing the buffer layer to form a buffer layer metallic oxide,
   wherein oxidizing the buffer layer is performed at least in part after depositing the overlayer is complete.

4. A method for fabricating a magnetoresistance sensor, comprising:
   providing a sensor structure including a free layer deposited upon a lower layered structure; and
   depositing an oxide structure overlying the free layer, wherein depositing the oxide structure includes
      depositing a buffer layer overlying the free layer, the buffer layer being a buffer-layer metal when deposited, thereafter
      depositing an overlayer overlying and contacting the buffer layer, the overlayer being an overlayer metallic oxide of an overlayer metal, and
      oxidizing the buffer layer to form a metallic oxide,
   wherein oxidizing the buffer layer includes oxidizing substantially none of the free layer.

* * * * *

UNITED STATES PATENT AND TRADEMARK OFFICE
CERTIFICATE OF CORRECTION

PATENT NO. : 6,913,782 B2  Page 1 of 1
APPLICATION NO. : 10/309938
DATED : July 5, 2005
INVENTOR(S) : Kula et al.

It is certified that error appears in the above-identified patent and that said Letters Patent is hereby corrected as shown below:

On the Title Page (54) and column 1, lines 1-4, In The Title: "Fabrication Of Self-Aligned Reflective/Protective Overlays On Magnetoresistance Sensors, And The Sensors" should be change to --Fabrication Of Self-Aligned Reflective/Protective Overlays On Magnetoresistance Sensors--

Signed and Sealed this

Twenty-fifth Day of November, 2008

JON W. DUDAS
*Director of the United States Patent and Trademark Office*